(12) United States Patent
Paul et al.

(10) Patent No.: US 6,629,426 B2
(45) Date of Patent: Oct. 7, 2003

(54) DEVICE USED IN SUPERCONDUCTOR TECHNOLOGY

(75) Inventors: Willi Paul, Zürich (CH); Martin Lakner, Birmenstorf (CH); Makan Chen, Rupperswil (CH); Lise Donzel, Wettingen (CH)

(73) Assignee: ABB Research Ltd, Zurich (CH)

( * ) Notice: Subject to any disclaimer, the term of this patent is extended or adjusted under 35 U.S.C. 154(b) by 0 days.

(21) Appl. No.: 10/012,305

(22) Filed: Dec. 12, 2001

(65) Prior Publication Data

US 2003/0154734 A1 Aug. 21, 2003

(30) Foreign Application Priority Data

Dec. 21, 2000 (EP) .............................. 00811222

(51) Int. Cl.$^7$ .................... F25D 23/12; F25B 19/00; H01B 12/00; H05K 7/20
(52) U.S. Cl. .................. 62/259.2; 62/51.1; 174/15.4; 361/689
(58) Field of Search ............................. 62/51.1, 259.2; 174/15.4; 361/689

(56) References Cited

U.S. PATENT DOCUMENTS

| | | | | |
|---|---|---|---|---|
| 3,667,246 A | * | 6/1972 | St. Lorant et al. ............ | 62/208 |
| 4,712,388 A | * | 12/1987 | Sullivan et al. ............. | 174/15.4 |
| 4,805,420 A | * | 2/1989 | Porter et al. ................ | 174/15.4 |
| 4,970,868 A | * | 11/1990 | Grebe et al. ................ | 62/259.2 |
| 5,166,776 A | * | 11/1992 | Dederer et al. .............. | 257/716 |
| 5,861,574 A | * | 1/1999 | Kotani et al. ............... | 174/15.4 |
| 5,907,473 A | * | 5/1999 | Przilas et al. ........... | 165/104.33 |
| 6,023,934 A | * | 2/2000 | Gold .......................... | 62/259.2 |
| 6,176,098 B1 | * | 1/2001 | Moriguchi .................. | 62/259.2 |

FOREIGN PATENT DOCUMENTS

| | | |
|---|---|---|
| DE | 19520205 A1 | 12/1996 |
| DE | 19746976 A1 | 12/1999 |
| EP | 0789368 B1 | 5/2000 |

\* cited by examiner

Primary Examiner—William C. Doerrler
(74) Attorney, Agent, or Firm—Burns, Doane, Swecker & Mathis, L.L.P.

(57) ABSTRACT

In a superconducting current limiter 1, in the limiting state pressure waves which may damage the superconductor are produced as a result of the evaporation of cooling liquid. According to the invention, the current limiter is not immersed in a cooling liquid, but rather is brought into thermal contact with a cooling fluid 22 which does not undergo a phase transition at over the operating temperature and therefore does not evaporate in the limiting state. A refrigeration reservoir 21, which may be the condensed phase of a gaseous cooling fluid or a cryogenic cooler, determines the operating temperature of the current limiter. One advantage is that it is now possible for a plurality of plate-like current-limiter modules 10, 10' of unlimited size to be arranged next to one another in the cooling fluid 22.

10 Claims, 2 Drawing Sheets

DEVICE USED IN SUPERCONDUCTOR TECHNOLOGY

FIELD OF THE INVENTION

The present invention relates to the field of applying high-temperature superconduction in the power supply sector. It also relates to a device used in superconductor technology in accordance with the preamble of patent claim 1.

BACKGROUND OF THE INVENTION

High-temperature superconductors are used, for example, in superconductive short-circuit current limiters for electrical distribution or transmission networks. A current limiter of this type makes use of the fact that a superconductor, at a suitably low operating temperature, only maintains its superconductivity while the current density of a current passing through it remains below a defined limit value which is referred to as the critical current density. If a short circuit occurs in the corresponding power supply network, the current in the current limiter rises to form a fault current which exceeds the critical value.

However, other superconductive components, such as transmission cables or transformers, also inherently have a critical current intensity ($I_c$). In rated operations, these components conduct a rated current $I_N$, which is lower than the critical current $I_c$, without losses. However, transients which are generated by switching-network components such as filter circuits or large consumers in the supply network may cause this rated current to increase briefly to an overcurrent.

Devices based on high-temperature superconductors are normally immersed in a liquid cooling medium, which for the sake of simplicity is preferably liquid nitrogen ($LN_2$), which is thermally insulated from the environment by a vessel known as a cryostat. As a result of a fault current or overcurrent in a superconductive component, the superconductor passes into the resistive state, i.e. the voltage which is applied at the corresponding section of the power supply network, at least for a short time, drops off completely (in the case of a short circuit) or partially at the superconductor. The Joule effect is generated, and under certain circumstances the superconductor is heated to well above its operating temperature, also heating the cooling medium which surrounds it. If this medium consists of liquid nitrogen, a large quantity of this liquid nitrogen is evaporated within a short time, so that an excess pressure is formed in the cryostat and pressure and shock waves propagate almost explosively. As a result, the superconductor device begins to vibrate and suffers irreparable mechanical damage, for example as a result of cracks being formed in the high-temperature superconductor ceramic or as a result of detachment of a conductor or support layer.

German laid-open specification DE-A 197 46 976 has shown a high-temperature superconductor arrangement for use in a current limiter. The arrangement comprises a superconductor layer and a perforated steel plate which is designed as an electrical bypass and, with the superconductor layer, forms a conductor assembly. In addition, the superconductor arrangement may be mechanically stabilized and electrically insulated by fiber-reinforced composite materials. In European patent EP-B 789 368, a vacuum-insulated superconductor device is connected, with good thermal conductivity, to a cryogenic cooler and is indirectly cooled by the latter.

SUMMARY OF THE INVENTION

It is an object of the present invention, in high-temperature superconductor applications in the field of power supply, to reduce the mechanical load on the superconductors and to increase their availability. This object is achieved by a device used in superconductor technology which has the features of patent claim 1 and by a method for operating this device which has the features of patent claim 10.

The core idea of the invention is to prevent evaporation of the cooling medium, with the associated occurrence of shock waves, in the event of abrupt heating of a superconductor arrangement and a cooling medium surrounding it. This is achieved by selecting as the cooling medium for the superconductor arrangement a fluid which does not undergo a phase transition even in the event of very slight heating. This cooling fluid is in thermal contact with a further cooling medium which forms a refrigeration reservoir with a nominal temperature ($T_N$). Therefore, said cooling fluid is either a gas or a liquid with a boiling point ($T_B$) which is higher than the nominal temperature $T_N$. In normal or rated operation, the refrigeration reservoir determines an operating temperature of the superconductor arrangement which is, accordingly, only slightly above the nominal temperature $T_N$. However, at the same time the refrigeration reservoir itself is only poorly thermally coupled to the superconductor and is therefore not affected, or is only affected with a delay, in the event of heating originating therefrom.

According to a first embodiment of the device according to the invention, the cooling fluid is the gaseous phase and the refrigeration reservoir the coexisting liquid phase of the same cooling medium. The nominal temperature $T_N$ corresponds to the boiling point ($T_B$) of the cooling medium, which can be influenced by means of the pressure of its gas phase.

According to a second embodiment, the superconductor arrangement comprises a support and a conductor assembly which is applied to the support and is additionally thermally connected to the refrigeration reservoir via the support. The additional thermal conductivity provided by the support accelerates in particular the process of initial cooling from room temperature to operating temperature when the device is started up.

The problem of the explosive evaporation of cooling liquid is particularly acute in current limiters, since these are designed, in the event of a short circuit, to build up a considerable resistance and to dissipate large amounts of energy within a very short time. The risk to resistive current limiters comprising plate-like modules each having an electrically insulating support and conductor tracks applied on both sides increases as the surface extent of the modules rises, because, given a constant module thickness, the greater the surface extent of the modules, i.e. the surface area of the plates, the greater the vibration amplitudes become. Since, according to the invention, reduced mechanical loads occur, it is now also possible to use modules which have a surface extent of more than 0.05 $m^2$.

In a further embodiment for current limiters having a plurality of modules, thermal compensation elements are provided between the modules for temperature homogenization purposes, which elements are preferably in contact with the refrigeration reservoir and themselves have a good thermal conductivity or are porous. The modules are preferably arranged in such a way that the spaces formed by them form a continuous passage for the cooling fluid. A pump may be used to assist the circulation of the cooling fluid.

The method according to the invention is characterized in that, in the case in which cooling fluid and refrigeration reservoir are two phases of the same cooling medium, during operation the superconductor arrangement is continuously wetted or showered with the liquid phase, i.e. a liquid cooling medium. Therefore, the gaseous cooling fluid forms continuously through evaporation of drops which strike the superconductor.

Further advantageous embodiments will emerge from the dependent patent claims.

BRIEF DESCRIPTION OF DRAWINGS

The invention is explained in more detail below with reference to exemplary embodiments in combination with the drawings, which each show a cross section through a resistive superconductor current limiter, and specifically.

The reference numerals used in the drawings are compiled in the list of reference symbols. Fundamentally, identical parts are provided with the same reference symbols.

DETAILED DESCRIPTION OF THE INVENTION

Figure 1:
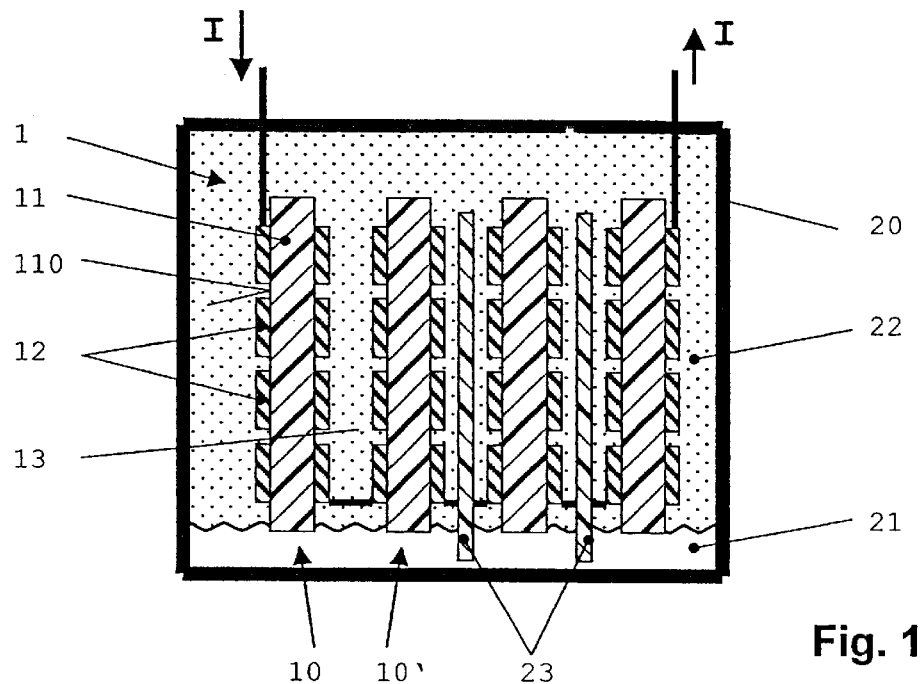
FIG. 1 with a cooling fluid which surrounds the modules of the current limiter and is the gaseous phase of a liquid cooling medium which has collected at the bottom of the cryostat.

The figures each illustrate a resistive current limiter 1; the invention can, of course, also be used for other high-temperature superconductor arrangements. The current limiter 1 comprises 4 plate-like modules 10, 10' which are connected electrically in series and through which a current I flows. Each module 10 comprises a two-dimensional support 11, on the at least one main support surface 110 of which a conductor track is applied, for example in meandering or helical form. The conductor track comprises a conductor assembly 12 comprising a superconductor and a normal conductor which is connected to the superconductor over a large surface area and presents an electrical bypass to the latter. Furthermore, it is conceivable for there to be electrically insulating and/or mechanical supporting layers (not shown), for example made from fiber composite material, as a covering for the conductor tracks. The modules 10, 10' are arranged next to one another and form spaces 13. The modules 10, 10' or their support 11 are supported on the base or the walls of a cryostat 20 which surrounds the current limiter 1. To ensure that there is no freezing of atmospheric humidity, the cryostat 20 is closed and is provided with a pressure-relief valve (not shown).

A first cooling medium serves as refrigeration reservoir 21 which is at a nominal temperature $T_N$ ($T_N$=77 K for liquid nitrogen $LN_2$ at atmospheric pressure). That side of a conductor assembly 12 which is remote from the main support surface 110 is in thermal contact with a cooling fluid 22, i.e. the conductor assembly 12 is thermally coupled to this cooling fluid 22, either directly or, if appropriate, via said fiber composite layer. Via the cooling fluid 22, the conductor assembly 12 is also in thermal contact with the refrigeration reservoir 21 and therefore, in the normal state, has an operating temperature which is equal to an slightly higher than the nominal temperature $T_N$. However, said thermal contact between the conductor assembly 12 and the refrigeration reservoir 21 is never direct, but rather is via the cooling fluid 22 or the support 11, which form temporary heat stores or buffers and only slowly pass on a brief heating originating from the conductor assembly 12.

In the event of a fault current or short circuit, after a critical value has been exceeded, the fault current generates the Joule effect in the conductor assembly 12. Depending on the design of the current limiter 1, in the process the superconductor is heated by at least a few tens of K. According to the invention, the cooling fluid 22 which is in direct thermal contact with the conductor assembly 12 does not now undergo a phase transition if it is also heated in such situations. If the cooling fluid 22 is a liquid and not a gas, it is sufficient for the boiling point $T_B$ of the liquid to be higher than the nominal temperature $T_N$. Because of its specific heat, in this situation the cooling liquid itself functions as a heat store, and the formation of bubbles which commences at the boiling point $T_B$ only takes place with a delay, if at all.

If the refrigeration reservoir 21 and the cooling fluid 22 are different phases of one cooling medium, its availability makes nitrogen $N_2$ an obvious solution. Liquid and gaseous nitrogen coexist at a boiling point $T_B$ which is 77 K at atmospheric pressure and can be reduced to 68 K by reducing the pressure to 0.3 bar. In the figures, a wavy line in each case indicates a phase boundary between a liquid and a gaseous phase of a cooling medium. In general, the gaseous cooling fluid 22 must not be reduced to below a pressure of 0.1 bar, since otherwise its cooling capacity or thermal conductivity is excessively impaired.

In FIG. 1, the lower part of the modules 10, 10' of the current limiter 1 is immersed in the refrigeration reservoir 21 which is at temperature $T_N$ and, as liquid cooling medium, covers the base of the cryostat 20. To prevent temperature gradients from being formed between the base of the cryostat 20 and the upper part of the modules, thermal compensation elements 23 are fitted. For the sake of clarity, only two compensation elements 23 of this type are shown in FIG. 1. They consist of a material with a good thermal conductivity, metals such as copper or aluminum also being conceivable under certain circumstances, or of a porous, absorbent material, so that the liquid cooling medium rises into a region of the space 13 as a result of capillary forces.

Figure 2:
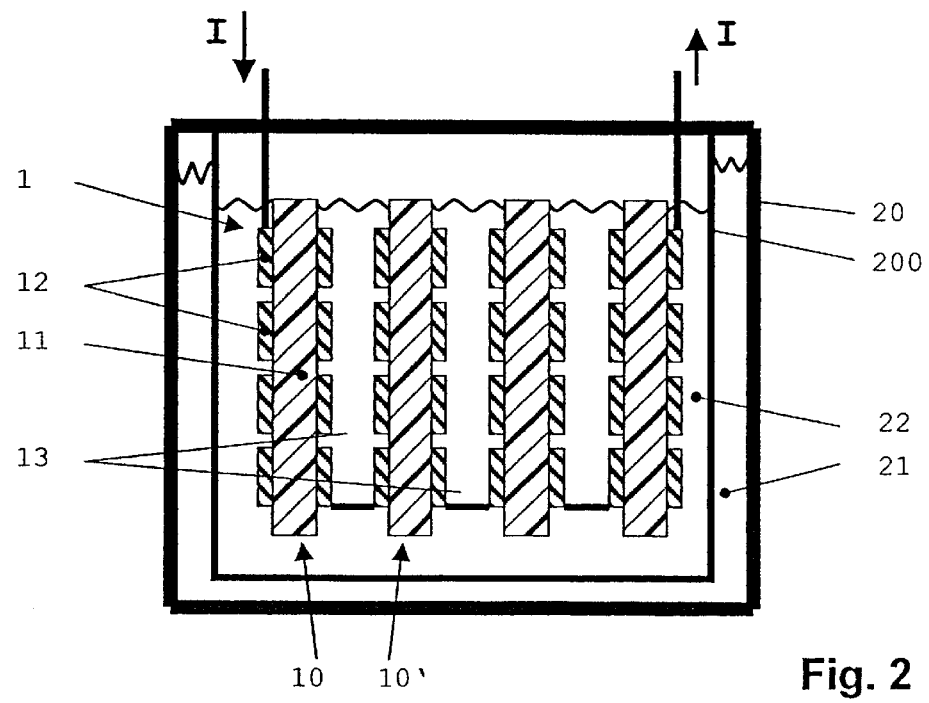
FIG. 2 with a cryostat which has separate vessels for the cooling fluid and a liquid cooling medium.

In FIG. 2, a partition 200 with good thermal conductivity divides the volume of the cryostat 20 into an inner partial volume and an outer partial volume which surrounds the inner partial volume. The superconductor arrangement 1 and the cooling fluid 22 are located in the inner partial volume, while the outer partial volume contains a liquid cooling medium as refrigeration reservoir 21. The liquid cooling medium and the cooling fluid 22 are therefore accommodated in separate parts of the cryostat 22 and in this case may also be at different pressures. By way of example, the outer partial volume contains liquid nitrogen $LN_2$ which has been cooled through the use of a vacuum to a nominal temperature $T_N$ of 65 K. The cooling fluid 22 which surrounds the superconductor is likewise liquid nitrogen $LN_2$, but under at least atmospheric pressure. Its boiling point $T_B$ is therefore still 77 K or more, but it is supercooled to nominal temperature $T_N$ by the surrounding refrigeration reservoir 21. Therefore, when the arrangement is heated, there is a temperature reserve of over 12 K, and only after this reserve has been used up is the cooling fluid 22 evaporated. Instead of liquid nitrogen $LN_2$, the cooling fluid 22 used may also be gaseous or liquid cooling media other than nitrogen. Examples of the latter which may be mentioned are trichloropropane $C_3H_5Cl_3$ with a boiling point $T_B$ of 429 K, or nitrogen trifluoride $NF_3$ ($T_B$=144 K) or oxygen difluoride $OF_2$ ($T_B$=128 K), the melting points of which are all well below 77 K. If the partition 200 is produced from an insulator, it simultaneously serves to dielectrically insulate the current limiter 1 from a possibly metallic outer wall of the cryostat 20.

Figure 3:
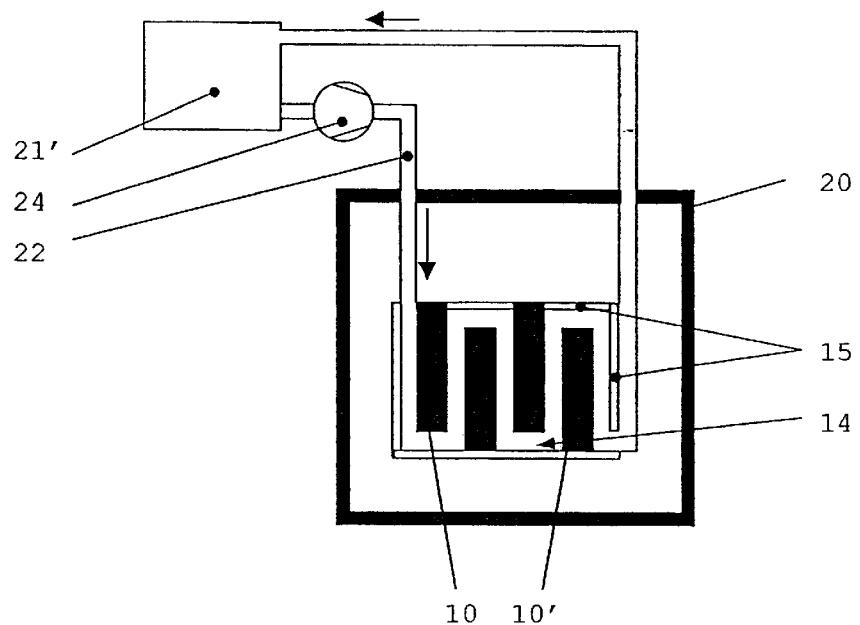
FIG. 3 with a passage which is formed by the modules and in which the cooling fluid circulates.

In FIG. 3, the current limiter is only indicated by four modules 10, 10'. These modules are arranged in such a way that the spaces 13 are connected one behind the other, forming a passage 14 for the cooling fluid 22. Additional support elements 15 form further walls of the passage 14. The cooling fluid 22 is forced through the passage 14 by means of a pump 24, and the required mass transfer is ensured. This prevents the final module 10' from being much warmer than the first module 10. The cooling fluid 22, after it has passed through the passage 14, is cooled back to $T_N$ in a cryogenic cooler which functions as refrigeration reservoir 21'. Instead of the arrangement illustrated, which is equivalent to the spaces being connected in series for the fluid, the cooling fluid 22 may also be divided and flow through a plurality of spaces in parallel.

Figure 4:
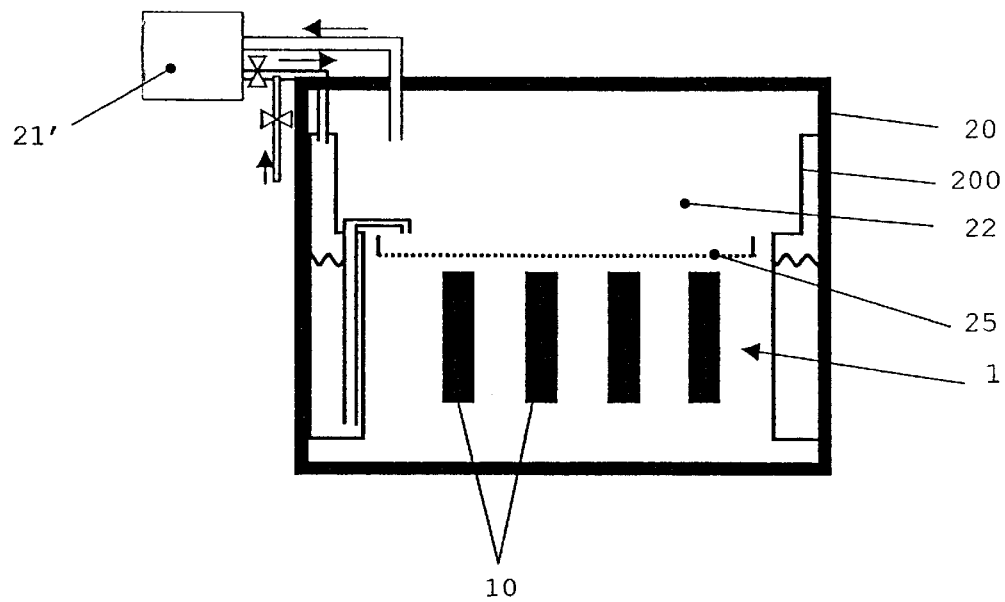
FIG. 4 with a showering means for wetting the modules with a liquid cooling medium.

In FIG. 4, there is likewise an outer partial volume along the outer wall of the cryostat 20, as a vessel for a liquid cooling medium. Showering means lead from this outer partial volume, enabling the superconductor arrangement 1 to be wetted or showered. According to the invention, these means are a shower and not, for example, a complete bath. Wetting takes place via an arrangement comprising nozzles or as a result of drops of liquid cooling medium dropping onto the superconductor arrangement from a perforated plate 25 with small openings. The drops which strike the conductor assembly evaporate very quickly even in rated operation, on account of the inevitable residual losses in the superconductor, and consequently a continuous film of liquid is not formed on its surface. Little or even no liquid collects at the bottom of the cryostat 20. The gaseous cooling fluid 22 is condensed again in a cryogenic cooler as refrigeration reservoir 21'. The cooling capacity is controlled by means of the hydrostatic pressure in the outer partial volume of the cryostat 20. The cooling capacity can be increased rapidly by supplying pressurized gas, which is suitable for cooling the superconductor arrangement 1 after a short circuit.

It will be understood that said refrigeration reservoir 21, which in FIG. 1 and FIG. 2 is formed by a liquid cooling medium, may also be a refrigeration machine (cryogenic cooler) which operates at the nominal temperature $T_N$. On the other hand, the cryogenic cooler shown in FIG. 3 and FIG. 4, which also acts as a refrigeration reservoir 21', can also be substituted by a cooling medium without changing the principle of the embodiment illustrated in any way. Cryogenic coolers, such as Stirling or exchange coolers, are based on known physical principles and provide a certain cooling capacity at a defined temperature $T_N$.

The problem of the formation of cracks in high-temperature superconductor ceramics which is caused by mechanical loads is not restricted to a specific type of high-temperature superconductor and/or a specific method for producing such a superconductor. By way of example, melt-processed $Bi_2Sr_2CaCu_2O_8$ is used in current limiter applications as a polycrystalline bulk material, with layer thickness of preferably between 50 and 1000 mm. In this way, it is possible to prepare modules with a surface extent in the plane perpendicular to the sectional plane of the figures of up to a few tenths of a square meter. However, as has been stated, modules of this size are more at risk in the event of vibrations, despite the use of fiber composite materials or of electrically insulated metallic substrates as supports or as additional reinforcement layers. For this reason, the prevention of vibrations in accordance with the invention for the first time allows large modules to be used. Incidentally, the modules are spaced apart laterally by 2–20 mm.

The invention which has been explained above with reference to the example of a resistive superconductor current limiter is in no way restricted to planar module or support geometries. The inventive idea of dispensing with immersing the superconductor arrangement in a cooling liquid is also useful for other components used in superconductor technology. By way of example, the support may be a coil body of a transformer, on which the conductor tracks are applied as windings. This too results in reduced mechanical damage and accordingly in a reduced need to replace the component and a higher availability of the device.

| LIST OF REFERENCE SYMBOLS | |
|---|---|
| 1 | Current limiter |
| 10, 10' | Module |
| 11 | Support |
| 110 | Main support surface |
| 12 | Conductor assembly |
| 13 | Space |
| 14 | Passage |
| 15 | Support element |
| 2 | Cooling arrangement |
| 20 | Cryostat |
| 200 | Partition |
| 21, 21' | Refrigeration reservoir |
| 22 | Cooling fluid |
| 23 | Thermal compensation element |
| 24 | Pump |
| 25 | Perforated plate |

What is claimed is:

1. A device used in superconductor technology, comprising
   a) a high-temperature superconductor arrangement having a support, which has a main support surface, and a conductor assembly, which is arranged on the main support surface and has high-temperature superconductor material, and
   b) a cooling arrangement with a refrigeration reservoir with a nominal temperature and a cooling fluid, which is in thermal contact with the refrigeration reservoir and which, during rated operation, is cooled by the refrigeration reservoir to said nominal temperature, in which device
   c) the conductor assembly is in thermal contact predominantly with the cooling fluid via a side which is remote from the main support surface, wherein
   d) the cooling fluid is mostly in a gaseous phase, and
   e) the device is a current limiter, or a transformer, or a transmission cable for use in power supply networks.

2. The device as claimed in claim 1, wherein the cooling fluid is a gaseous phase of a cooling medium, and the refrigeration reservoir comprises a liquid phase of the same cooling medium.

3. The device as claimed in claim 1, wherein the support is in thermal contact with the refrigeration reservoir.

4. The device as claimed in claim 1, wherein the refrigeration reservoir comprises a cooling medium which is separated from the cooling fluid by a partition and differs from the cooling fluid in terms of its composition or pressure.

5. The device as claimed in claim 1, wherein the high-temperature superconductor arrangement is a resistive current limiter with plate-like modules.

6. The device as claimed in claim 5, werein the modules have a surface extent of at least 0.05 $m^2$.

7. The device as claimed in claim 5, wherein at least two modules are arranged next to one another and form a space in which a thermal compensation element is provided for temperature homogenization purposes.

8. The device as claimed in claim 5, wherein the modules form a passage for the cooling fluid.

9. The device as claimed in claim 8, wherein a pump is provided for the purpose of circulating the cooling fluid through the passage.

10. A method for operating a device comprising a high-temperature superconductor arrangement and a cooling arrangement, in which a) a conductor assembly comprising superconductor material is arranged on a main support surface of a support, and b) is in thermal contact, via a side which is remote from the support, with a cooling fluid comprising mostly a gaseous phase of a cooling medium, c) which cooling fluid is in thermal contact with a refrigeration reservoir comprising a liquid phase of the cooling medium, wherein d) the high-temperature superconductor arrangement is wetted with the liquid phase of the cooling medium.

* * * * *